United States Patent
Hayashi

(10) Patent No.: US 9,112,146 B2
(45) Date of Patent: Aug. 18, 2015

(54) RESISTANCE RANDOM ACCESS MEMORY DEVICE

(71) Applicant: KABUSHIKI KAISHA TOSHIBA, Minato-ku (JP)

(72) Inventor: Tetsuya Hayashi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 64 days.

(21) Appl. No.: 14/017,507

(22) Filed: Sep. 4, 2013

(65) Prior Publication Data
US 2014/0319442 A1 Oct. 30, 2014

(30) Foreign Application Priority Data
Apr. 26, 2013 (JP) ................... 2013-094187

(51) Int. Cl.
*H01L 45/00* (2006.01)
*H01L 27/24* (2006.01)

(52) U.S. Cl.
CPC .............. *H01L 45/12* (2013.01); *H01L 45/085* (2013.01); *H01L 45/1233* (2013.01); *H01L 45/145* (2013.01); *H01L 45/146* (2013.01); *H01L 45/1675* (2013.01); *H01L 27/2463* (2013.01); *H01L 27/2481* (2013.01)

(58) Field of Classification Search
CPC ... H01L 45/08; H01L 45/085; H01L 45/1233; H01L 45/124; H01L 27/2472; H01L 27/2481; H01L 27/249
USPC .............................. 257/2–5, E45.001, E27.004
See application file for complete search history.

(56) References Cited

U.S. PATENT DOCUMENTS

| | | | | |
|---|---|---|---|---|
| 7,663,909 | B2* | 2/2010 | Philipp et al. | 365/163 |
| 8,062,940 | B2* | 11/2011 | Ko et al. | 438/197 |
| 8,106,376 | B2* | 1/2012 | Lai et al. | 257/4 |
| 2012/0074374 | A1 | 3/2012 | Jo | |
| 2012/0091422 | A1* | 4/2012 | Choi et al. | 257/4 |
| 2012/0267597 | A1* | 10/2012 | Lung | 257/4 |
| 2013/0037776 | A1 | 2/2013 | Nishi et al. | |
| 2013/0140515 | A1* | 6/2013 | Kawashima et al. | 257/4 |
| 2013/0234087 | A1 | 9/2013 | Yamauchi et al. | |

FOREIGN PATENT DOCUMENTS

| | | |
|---|---|---|
| JP | 6-28841 A | 2/1994 |
| JP | 2011-40483 A | 2/2011 |
| JP | 2011-211101 A | 10/2011 |
| JP | 2012-33649 A | 2/2012 |
| JP | 2013-187256 A | 9/2013 |

* cited by examiner

*Primary Examiner* — Allison P Bernstein
(74) *Attorney, Agent, or Firm* — Oblon, McClelland, Maier & Neustadt, L.L.P.

(57) ABSTRACT

A resistance random access memory device includes a first resistance change layer, a second resistance change layer and an ion source layer. The first resistance change layer is made of a first material. The second resistance change layer is provided on the first resistance change layer. The second resistance change layer is made of a second material different from the first material. The ion source layer is provided on the second resistance change layer. The ion source layer includes a metal. The metal is able to reversibly move within the first resistance change layer and within the second resistance change layer. A width of the first resistance change layer is narrower than a width of the second resistance change layer.

17 Claims, 15 Drawing Sheets

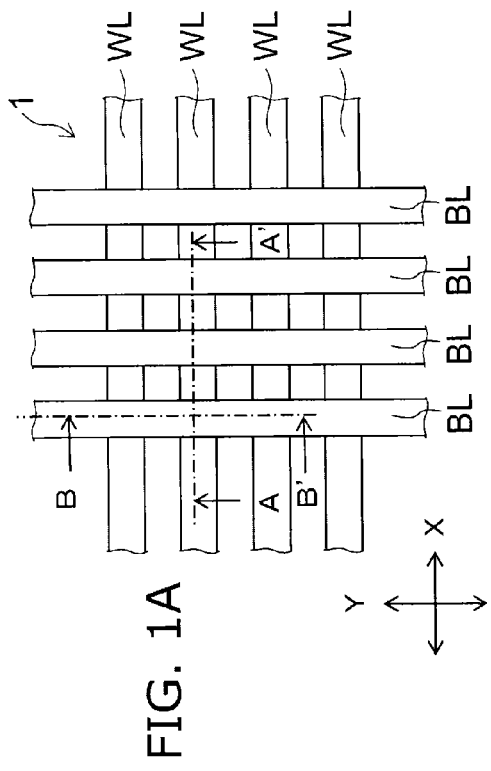
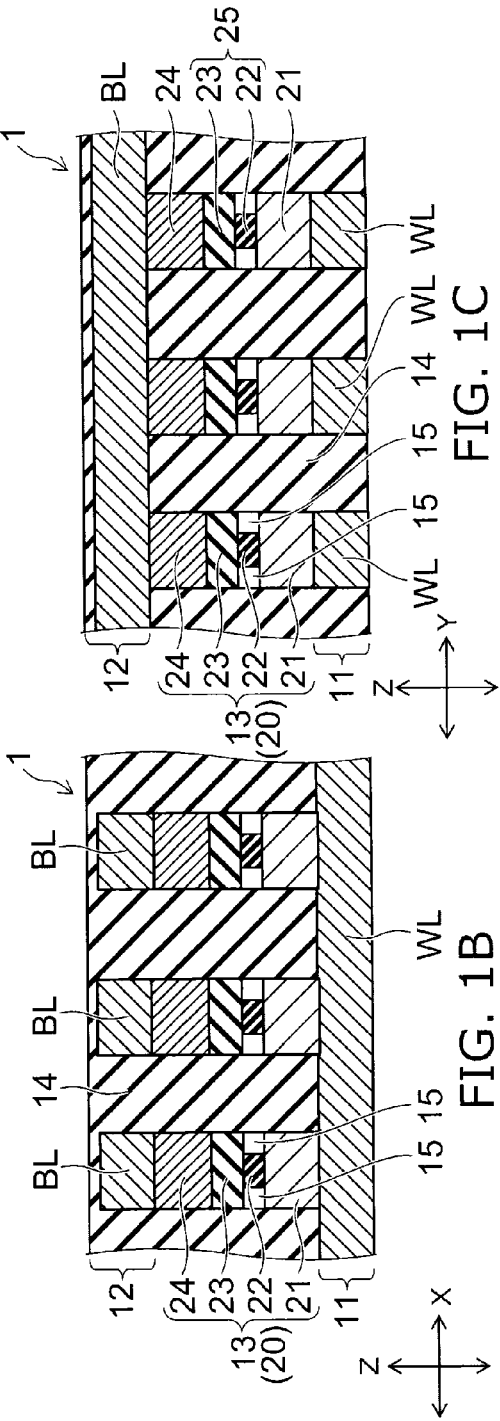
FIG. 1A
FIG. 1B
FIG. 1C

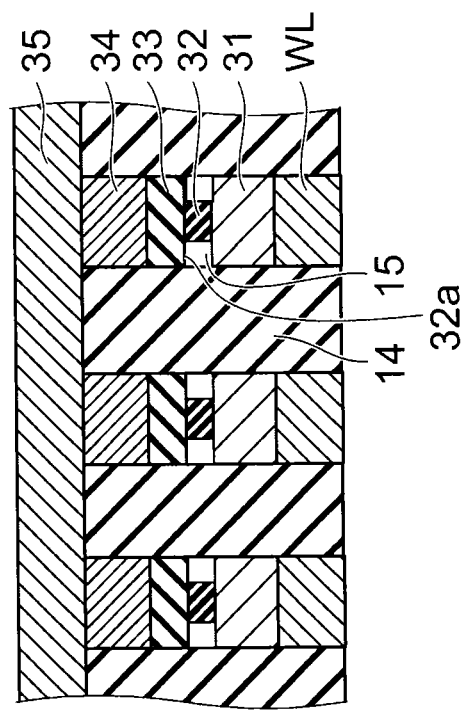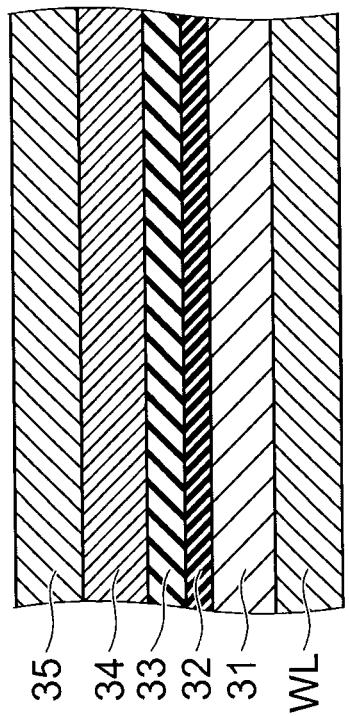
FIG. 6A
FIG. 6B

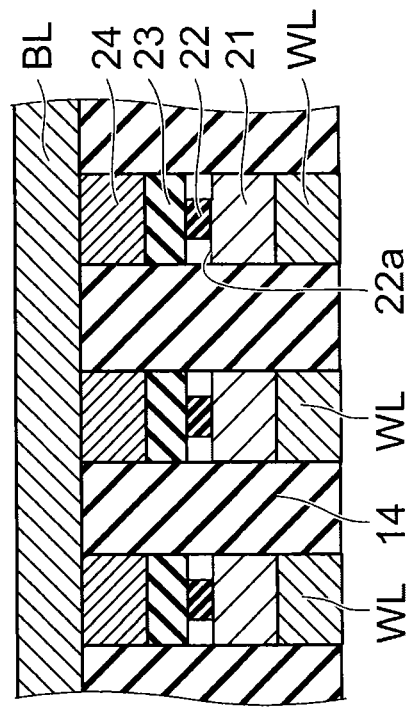
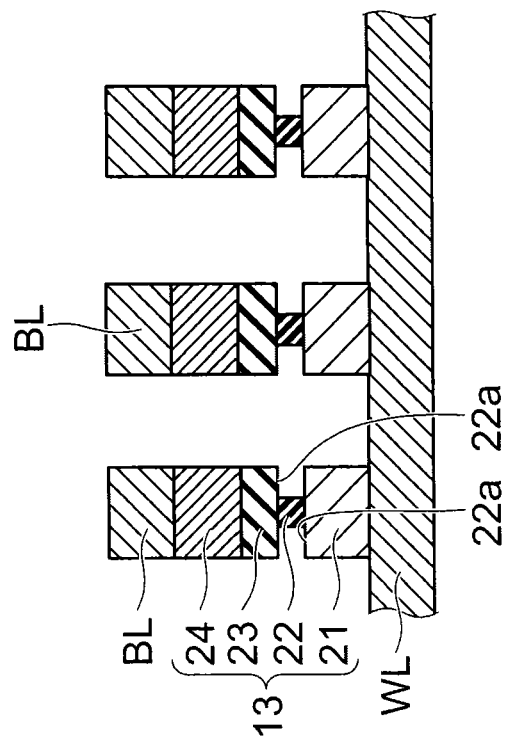
FIG. 8A
FIG. 8B

RESISTANCE RANDOM ACCESS MEMORY DEVICE

CROSS-REFERENCE TO RELATED APPLICATIONS

This application is based upon and claims the benefit of priority from Japanese Patent Application No. 2013-094187, filed on Apr. 26, 2013; the entire contents of which are incorporated herein by reference.

FIELD

Embodiments described herein relate generally to a resistance random access memory device.

BACKGROUND

In recent years, a resistance random access memory device has been proposed in which data is stored by changing the electrical resistance value of a resistance change layer by causing metal ions to diffuse inside the resistance change layer to form a filament inside the resistance change layer and by causing the filament to disappear.

BRIEF DESCRIPTION OF THE DRAWINGS

FIG. 1A is a plan view showing a resistance random access memory device according to a first embodiment;

FIG. 1B is a cross-sectional view along A-A' shown in FIG. 1A;

FIG. 1C is a cross-sectional view along line B-B' shown in FIG. 1A;

FIGS. 2A and 2B to FIGS. 8A and 8B are cross-sectional views of different processing stages in a method for manufacturing the resistance random access memory device according to the first embodiment;

DETAILED DESCRIPTION

Figure 2A:
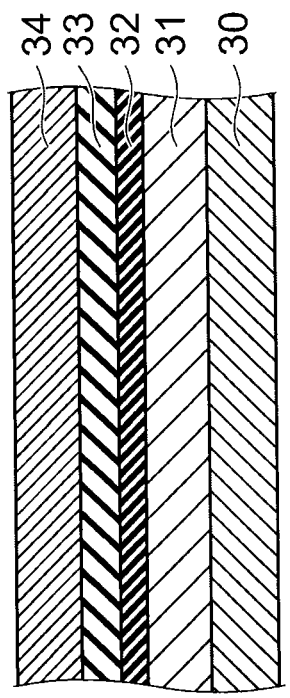
Figure 2A:
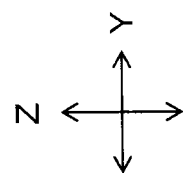

In general, according to one embodiment, a resistance random access memory device includes a first resistance change layer, a second resistance change layer and an ion source layer. The first resistance change layer is made of a first material. The second resistance change layer is provided on the first resistance change layer. The second resistance change layer is made of a second material different from the first material. The ion source layer is provided on the second resistance change layer. The ion source layer includes a metal. The metal is able to reversibly move within the first resistance change layer and within the second resistance change layer. A width of the first resistance change layer is narrower than a width of the second resistance change layer.

Embodiments of the invention will now be described with reference to the drawings.

First, a first embodiment will be described.

FIG. 1A is a plan view showing a resistance random access memory device according to the embodiment; FIG. 1B is a cross-sectional view along A-A' shown in FIG. 1A; and FIG. 1C is a cross-sectional view along line B-B' shown in FIG. 1A.

As shown in FIGS. 1A to 1C, a word line interconnect layer 11 including multiple word lines WL extending in an X direction is provided in the resistance random access memory device 1 (hereinbelow, also called simply the "device 1") according to the embodiment. Also, a bit line interconnect layer 12 including multiple bit lines BL extending in a Y direction is provided on the word line interconnect layer 11. The X direction and the Y direction intersect each other, e.g., are orthogonal to each other. The word lines WL and the bit lines BL are formed of a metal such as, for example, tungsten (W), etc. Only the word lines WL and the bit lines BL are shown in FIG. 1A for convenience of illustration.

A pillar 13 extending in a Z direction is provided at the most proximal portion between each of the word lines WL and each of the bit lines BL. Thereby, the multiple pillars 13 are arranged in a matrix configuration along the X direction and the Y direction in the device 1. An inter-layer insulating film 14 made of, for example, silicon oxide is disposed between the word lines WL and the bit lines BL, between the word lines WL and the pillars 13, and between the bit lines BL and the pillars 13. The Z direction is a direction that intersects, e.g., is orthogonal to, both the X direction and the Y direction.

In the pillar 13, an electrode layer 21, a rectifying layer 22, a retention layer 23, and an ion source layer 24 are stacked in this order from the word line WL side toward the bit line BL side. The electrode layer 21 is formed of, for example, polysilicon that is caused to be a conductor by an impurity being introduced. Also, the retention layer 23 contacts the ion source layer 24.

The rectifying layer 22 is formed of, for example, non-doped amorphous silicon (a-Si). The retention layer 23 is formed of, for example, silicon oxide, e.g., $SiO_2$. The ion source layer 24 is a layer including a metal that is able to move through the rectifying layer 22 and through the retention layer 23 and is formed of, for example, silver (Ag). As described below, the rectifying layer 22 and the retention layer 23 are resistance change layers having electrical resistance values that change by a filament being formed in the interiors by metal ions being supplied from the ion source layer 24. A variable resistance film 25 is formed of the rectifying layer 22 and the retention layer 23.

At the side surface of the pillar 13, the side surface of the rectifying layer 22 recedes inward; and the width of the rectifying layer 22 is narrower than the widths of the electrode layer 21, the retention layer 23, and the ion source layer 24. The space between the rectifying layer 22 and the inter-layer insulating film 14 is an air gap 15. A memory cell 20 is formed of the electrode layer 21, the rectifying layer 22, the retention layer 23, and the ion source layer 24 that are formed in each of the pillars 13. The width of the retention layer 23 is, for example, several tens of nanometers; and the width of the rectifying layer 22 is about several tens of percent narrower than the width of the retention layer 23 when the width of the retention layer 23 is used as a reference. Further, the total thickness of the rectifying layer 22 and the retention layer 23 is several tens of nanometers, e.g., 50 nm.

In other words, the device 1 includes the variable resistance film 25, and the ion source layer 24 that includes a metal and is stacked with the variable resistance film 25. The resistivity of the variable resistance film 25 is higher than the resistivity of the ion source layer 24. Also, the width of the variable resistance film 25 at a portion of the variable resistance film 25 other than the surface of the variable resistance film 25 on the ion source layer 24 side is less than the width of the variable resistance film 25 at the surface on the ion source layer 24 side. Further, the ions of the metal included in the ion source layer 24 are able to move through the variable resistance film 25.

A method for manufacturing the resistance random access memory device according to the embodiment will now be described.

FIGS. 2A and 2B to FIGS. 8A and 8B are cross-sectional views of processes, showing the method for manufacturing the resistance random access memory device according to the embodiment.

Figure 2B:
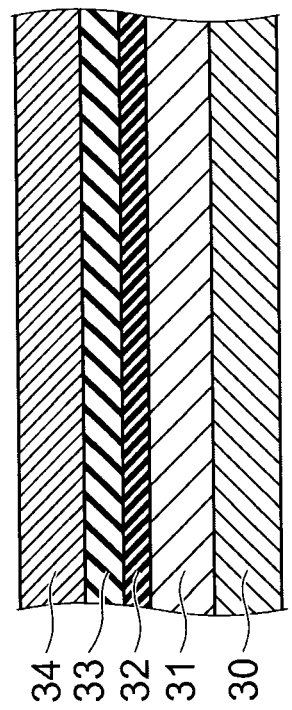
Figure 2B:
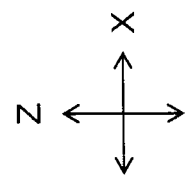

FIG. 2A shows a cross section corresponding to the cross section along line A-A' shown in FIG. 1A; and FIG. 2B shows a cross section corresponding to the cross section along line B-B' shown in FIG. 1A. This is the same for similar cross-sectional views in FIGS. 3A and 3B and subsequent drawings.

First, as shown in FIGS. 2A and 2B, for example, a conductive layer 30 made of tungsten is formed; and, for example, a polysilicon layer 31 made of polysilicon into which boron (B) is introduced, an amorphous silicon layer 32, a silicon oxide layer 33, and a silver layer 34 are formed in this order on the conductive layer 30. At this stage, all of these layers are continuous layers.

Figures 3A, 3B:
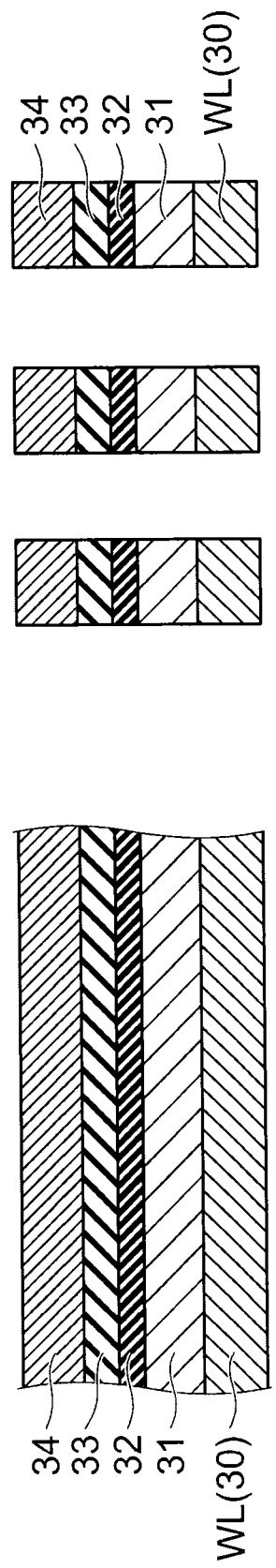

Then, as shown in FIGS. 3A and 3B, the silver layer 34, the silicon oxide layer 33, the amorphous silicon layer 32, the polysilicon layer 31, and the conductive layer 30 are patterned into a line-and-space (L/S) configuration extending in the X direction by selectively removing these layers by lithography and etching. Thereby, the conductive layer 30 is patterned into line configurations extending in the X direction to become the word lines WL.

Figure 4B:
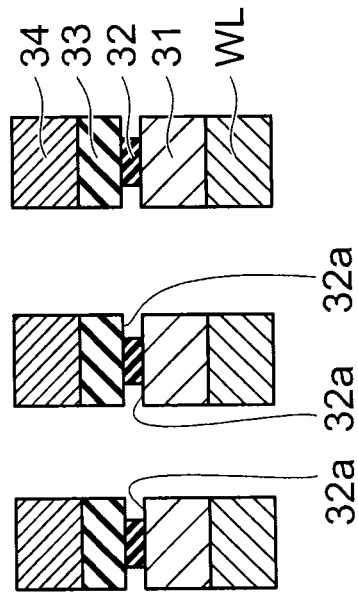
Figure 4B:
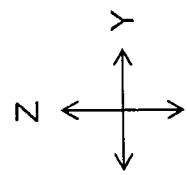
Figure 4A:
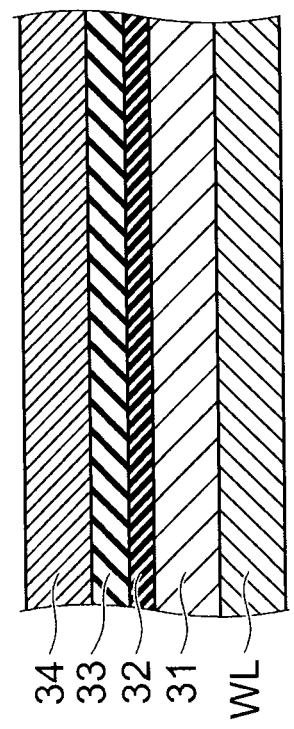
Figure 4A:
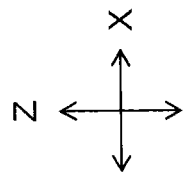

Continuing as shown in FIGS. 4A and 4B, side etching of the two side surfaces, i.e., the side surfaces facing the Y direction, of the amorphous silicon layer 32 patterned into the line configurations is performed by etching at conditions such that the etching rate of amorphous silicon is higher than the etching rate of silicon oxide. The etching is performed by, for example, dry etching using a gas including fluorine. Thereby, the two side surfaces of the amorphous silicon layer 32 recede to make a recess 32a. As a result, the width of the amorphous silicon layer 32 becomes narrower than the width of the silicon oxide layer 33 as viewed from the X direction.

Figure 5B:
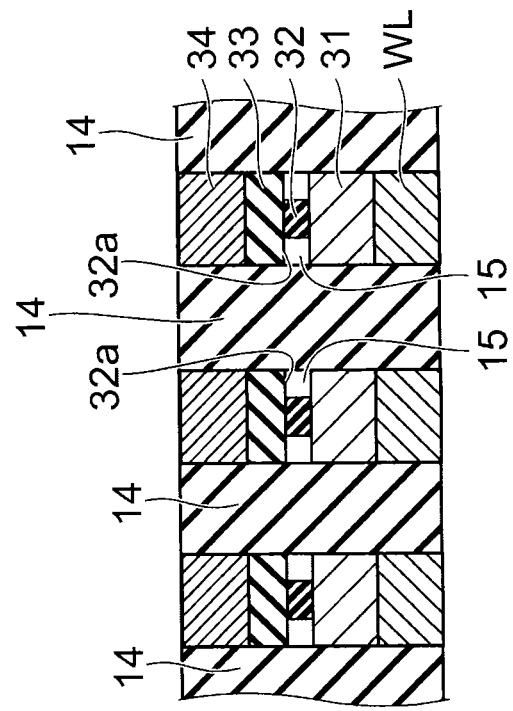
Figure 5A:
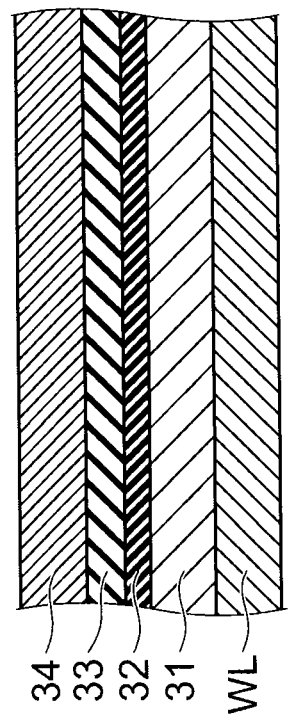

Then, by depositing silicon oxide as shown in FIGS. 5A and 5B, the inter-layer insulating film 14 is filled between the stacked bodies patterned into the line-and-space configuration. At this time, the inter-layer insulating film 14 is not filled into the recess 32a of the amorphous silicon layer 32 to leave the interior of the recess 32a as the air gap 15 by depositing the silicon oxide by a method having poor fillability, e.g., by CVD (chemical vapor deposition) in which the conditions are adjusted to provide poor fillability. Then, CMP (chemical mechanical polishing) is performed using the silver layer 34 as a stopper to planarize the upper surface of the inter-layer insulating film 14.

Continuing as shown in FIGS. 6A and 6B, a conductive layer 35 made of, for example, tungsten is formed on the upper surface of the structural body made of the inter-layer insulating film 14 and on the upper surface of the stacked body in which the word line WL, the polysilicon layer 31, the amorphous silicon layer 32, the silicon oxide layer 33, and the silver layer 34 are stacked.

Figure 7B:
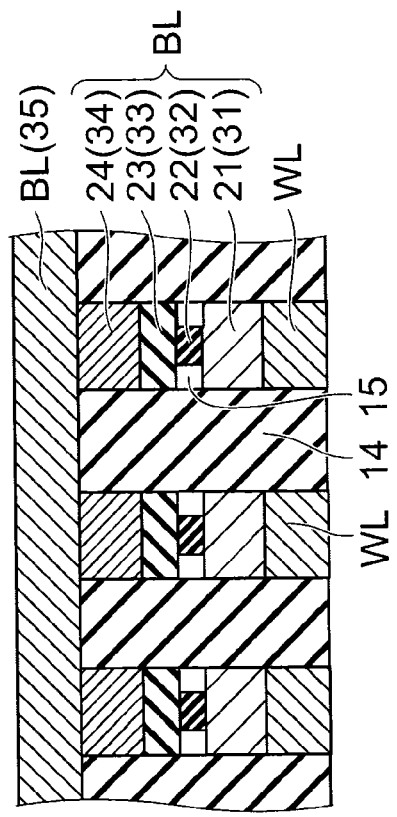
Figure 7A:
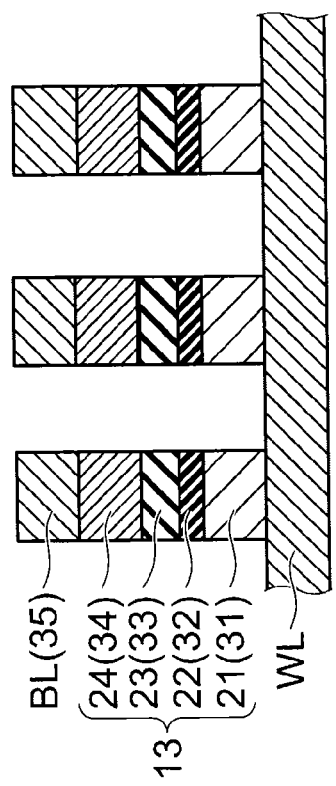

Then, as shown in FIGS. 7A and 7B, the conductive layer 35, the silver layer 34, the silicon oxide layer 33, the amorphous silicon layer 32, the polysilicon layer 31, and the inter-layer insulating film 14 are patterned into a line-and-space configuration extending in the Y direction by selectively removing these layers by performing lithography and etching. Thereby, the conductive layer 35 is patterned into line configurations extending in the Y direction to become the bit lines BL. Also, the stacked body made of the polysilicon layer 31, the amorphous silicon layer 32, the silicon oxide layer 33, and the silver layer 34 is patterned into pillar configurations to form the pillars 13. At this time, the electrode layer 21 is formed from the polysilicon layer 31; the rectifying layer 22 is formed from the amorphous silicon layer 32; the retention layer 23 is formed from the silicon oxide layer 33; and the ion source layer 24 is formed from the silver layer 34.

Continuing as shown in FIGS. 8A and 8B, side etching of the side surfaces of the rectifying layer 22 patterned into the pillar configuration is performed by etching at conditions such that the etching rate of amorphous silicon is higher than the etching rate of silicon oxide. The etching is, for example, dry etching using a gas including fluorine. Thereby, the side surfaces of the amorphous silicon layer 32 facing the X direction recede to make a recess 22a. As a result, the width of the rectifying layer 22 becomes narrower than the width of the retention layer 23 as viewed from both the X direction and the Y direction.

Then, the inter-layer insulating film 14 is formed between the pillars 13 and between the bit lines BL by depositing silicon oxide by a method having poor fillability. At this time, the inter-layer insulating film 14 is not filled into the recess 22a to make the air gap 15. Then, CMP is performed using the bit lines BL as a stopper to planarize the upper surface. Thus, the resistance random access memory device 1 shown in FIGS. 1A to 1C is manufactured.

Operations of the embodiment will now be described.

FIGS. 9A to 9D are cross-sectional views schematically showing operations of the resistance random access memory device according to the embodiment.

Figures 9A, 9B, 9C, 9D:
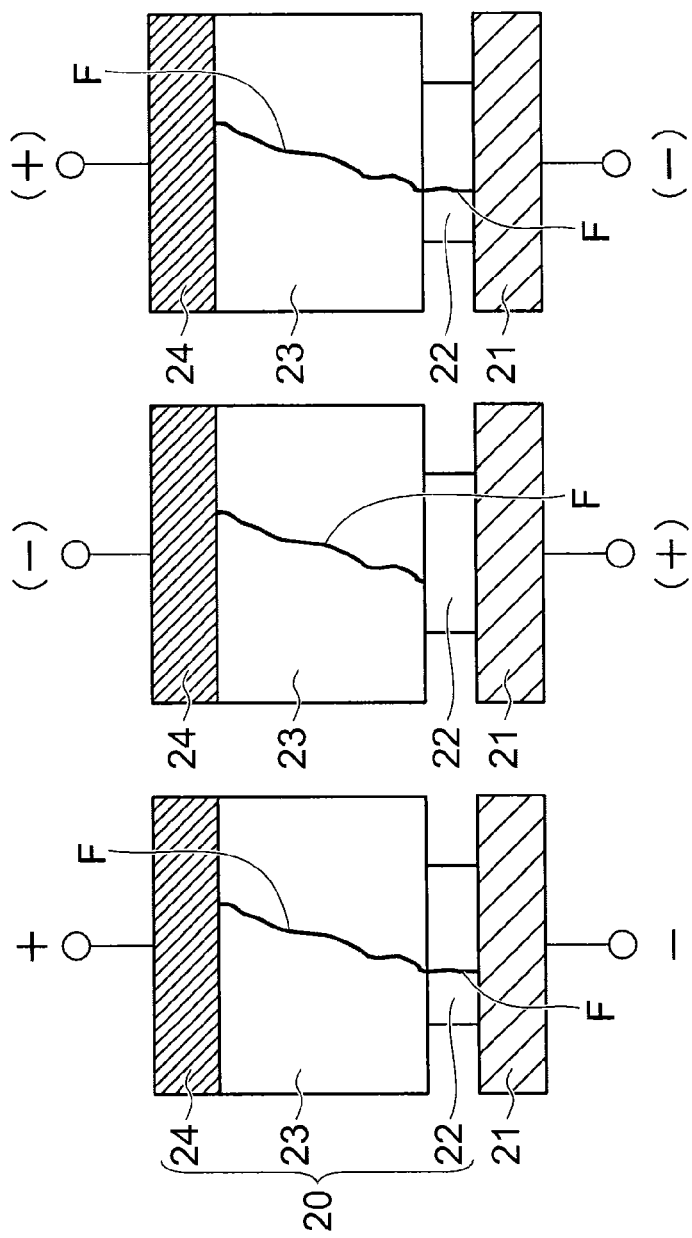
FIGS. 9A to 9D are cross-sectional views schematically showing operations of the resistance random access memory device according to the first embodiment.

In the resistance random access memory device 1 according to the embodiment as shown in FIG. 9A, when a positive voltage is applied to the memory cell 20 to cause the bit line BL (referring to FIGS. 1A to 1C) to be positive and the word line WL (referring to FIGS. 1A to 1C) to be negative, the silver atoms included in the ion source layer 24 are ionized and move through the variable resistance film 25, which is made of the retention layer 23 and the rectifying layer 22, toward the word line WL which is negative. Then, the ions combine with the electrons supplied from the word line WL and precipitate inside the variable resistance film 25. Thereby, a filament F made of silver forms inside the variable resistance film 25. By the filament F being formed, the electrical resistance value of the variable resistance film 25 between the ion source layer 24 and the electrode layer 21 decreases; and the memory cell 20 is switched to the low resistance state. This operation is called "setting;" and the positive voltage that is applied at this time is called the "set voltage." At this time, the filament F forms and decomposes more easily in the rectifying layer 22 than in the retention layer 23.

Because the filament F decomposes easily in the rectifying layer 22, after the memory cell 20 is switched to the low resistance state as shown in FIG. 9A and after a constant amount of time has passed, the filament F inside the rectifying layer 22 decomposes and disappears as shown in FIG. 9B. On the other hand, the filament F inside the retention layer 23 remains because the filament F inside the retention layer 23 does not decompose easily. In this state, a current substantially does not flow in the memory cell 20 even when a weak negative voltage is applied because the filament F is not formed inside the rectifying layer 22. Moreover, the filament F inside the retention layer 23 does not disappear due to the weak negative voltage.

On the other hand, as shown in FIG. 9C, the filament F forms again inside the rectifying layer 22 when a positive read-out voltage that is lower than the set voltage is applied to the memory cell 20 in the state shown in FIG. 9B because the filament F forms more easily inside the rectifying layer 22 than inside the retention layer 23. Thereby, the memory cell 20 returns to the low resistance state; and the on-state current flows. Thus, once the memory cell 20 is switched to the low resistance state by performing the set operation shown in FIG. 9A, the filament F subsequently is re-formed inside the rectifying layer 22 as shown in FIG. 9C by applying the positive read-out voltage even in the case where the state switches to the state shown in FIG. 9B by changing over time. As a result, the on-state current flows inside the memory cell 20; and the memory cell 20 can be identified as being in the low resistance state.

Further, when a negative voltage is applied to the memory cell 20 as shown in FIG. 9D to cause the bit line BL to be negative and the word line WL to be positive, the silver atoms included in the filament F that is inside the retention layer 23 and inside the rectifying layer 22 are ionized and move toward the ion source layer 24. Then, the ions combine with the electrons inside the ion source layer 24 and again become silver atoms. Thereby, at least a portion of the filament F that is inside the retention layer 23 and inside the rectifying layer 22 disappears; and the electrical resistance value increases. As a result, the memory cell 20 is switched to the high resistance state. This operation is called "resetting;" and the negative voltage that is applied at this time is called the "reset voltage." The on-state current does not flow even when the read-out voltage is applied to the memory cell 20 in the high resistance state.

Thus, the memory cell 20 can be switched to the low resistance state by applying the set voltage to the memory cell 20 as shown in FIG. 9A and can be switched to the high resistance state by applying the reset voltage to the memory cell 20 as shown in FIG. 9D. Thereby, a value can be programmed to the memory cell 20. Also, it can be discriminated whether the memory cell 20 is in the low resistance state or in the high resistance state by applying the read-out voltage, which is a positive voltage that is lower than the set voltage, to the memory cell 20 as shown in FIG. 9C. Thereby, the value that is programmed to the memory cell 20 can be read. On the other hand, as shown in FIG. 9B, a current substantially does not flow even when a negative voltage that is about the same as the read-out voltage is applied to the memory cell 20 because the filament F is not formed inside the rectifying layer 22. Thereby, the memory cell 20 can be provided with a rectifying property.

Effects of the embodiment will now be described.

In the embodiment, the width of the rectifying layer 22 is narrower than the width of the retention layer 23; and the pillar is narrower at the position of the rectifying layer 22. Although the air gap 15 is made around the rectifying layer 22, the filament F is not formed inside the air gap 15. Therefore, the region inside the rectifying layer 22 where the filament F is formed is constrained; and the filament F is formed at substantially the same position each set operation. Therefore, the set voltage and set time that are necessary for setting are uniform between set operations; the read-out voltage and read-out time that are necessary for reading are uniform between read-out operations; and the operations of the memory cell 20 are stabilized.

In the embodiment, the width of the retention layer 23 is wider than the width of the rectifying layer 22. Thereby, the contact surface area between the retention layer 23 and the ion source layer 24 is large; and the adhesion between the retention layer 23 and the ion source layer 24 is good. As a result, film separation between the retention layer 23 and the ion source layer 24 can be prevented and the mechanical strength of the pillar 13 can be ensured even in the case where the pillar 13 is downscaled. Thereby, breakage of the pillar 13 is suppressed; and the operations of the memory cell 20 are stabilized. This effect is effective even in the case where another layer is interposed between the retention layer 23 and the ion source layer 24.

On the other hand, if the width of the rectifying layer 22 is set to be about the same as that of the retention layer 23, the operations of the memory cell 20 do not stabilize because the filament F is formed at various positions inside the rectifying layer 22 in each set operation and read-out operation. For example, in the read-out operation shown in FIG. 9C, the time from when the read-out voltage is applied to when the filament F is formed inside the rectifying layer 22 undesirably fluctuates. Therefore, it is necessary to set the read-out voltage to be high to perform the read-out operation reliably within the prescribed amount of time; and the margin of the read-out operation decreases.

Moreover, if the width of the retention layer 23 is set to be about the same as that of the rectifying layer 22, the formation region of the filament F is limited; but the adhesion decreases because the contact surface area between the retention layer 23 and the ion source layer 24 decreases. As a result, the mechanical strength of the pillar 13 is insufficient; and in the case where the pillar 13 is downscaled, breakage occurs easily; and instability occurs.

Conversely, according to the embodiment, the formation position of the filament F is stabilized by making the rectifying layer 22 relatively fine; and the adhesion with the ion source layer 24 is ensured by making the retention layer 23 relatively wide. As a result, the operations of the memory cell 20 can be stabilized.

The electrode layer 21 may not be provided. Further, as described below, the electrode layer 21 may be patterned into an interconnect configuration extending in the X direction. In such a case, the configuration of the electrode layer 21 is not a portion of the pillar 13 but is integrated with the word line WL.

Although an example is illustrated in the embodiment in which the rectifying layer 22 is formed of amorphous silicon and the retention layer 23 is formed of silicon oxide, this is not limited thereto. For example, the rectifying layer 22 may be formed of silicon oxide, e.g., $SiO_2$; and the retention layer 23 may be formed of hafnium oxide, e.g., $HfO_2$, or hafnium oxynitride. The retention layer 23 also may be formed of a metal oxide such as tantalum oxide, lanthanum oxide, etc., or a metal oxynitride. Further, the rectifying layer 22 may be one type of material selected from the group consisting of silicon, silicon oxide, silicon nitride, hafnium oxide and hafnium oxynitride or a combination of two or more types of materials selected from the group; and the retention layer 23 may be one type of material selected from the group or a combination of two or more types of materials selected from the group. Silicon includes both amorphous silicon and crystalline silicon; and crystalline silicon includes both polysilicon and monocrystalline silicon. Such variations also are applicable similarly to other embodiments described below.

A second embodiment will now be described.

Figure 10B:
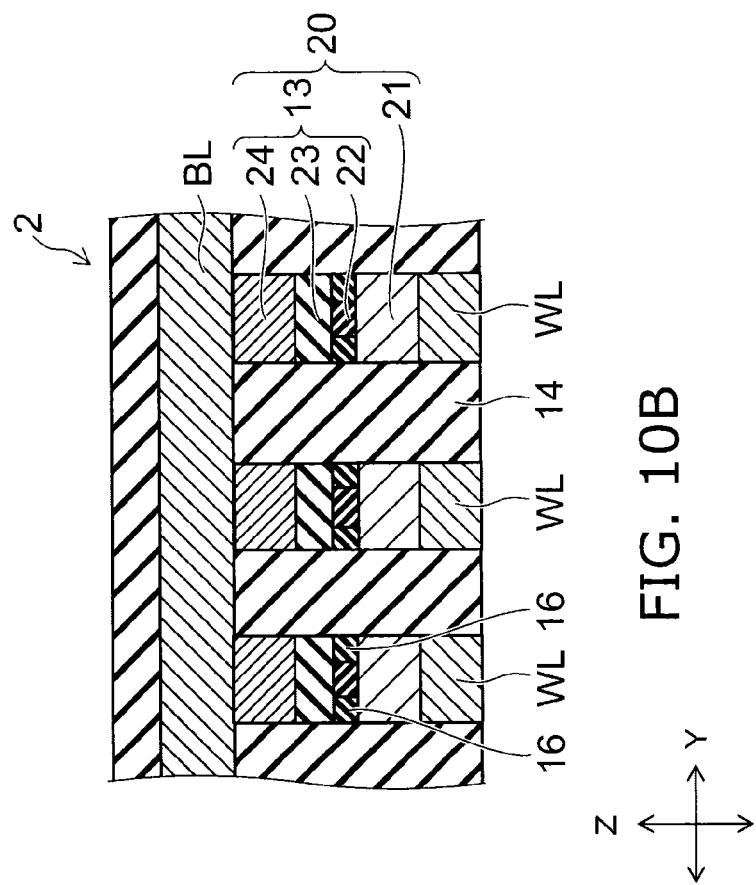
FIGS. 10A and 10B are cross-sectional views showing a resistance random access memory device according to a second embodiment.
Figure 10A:
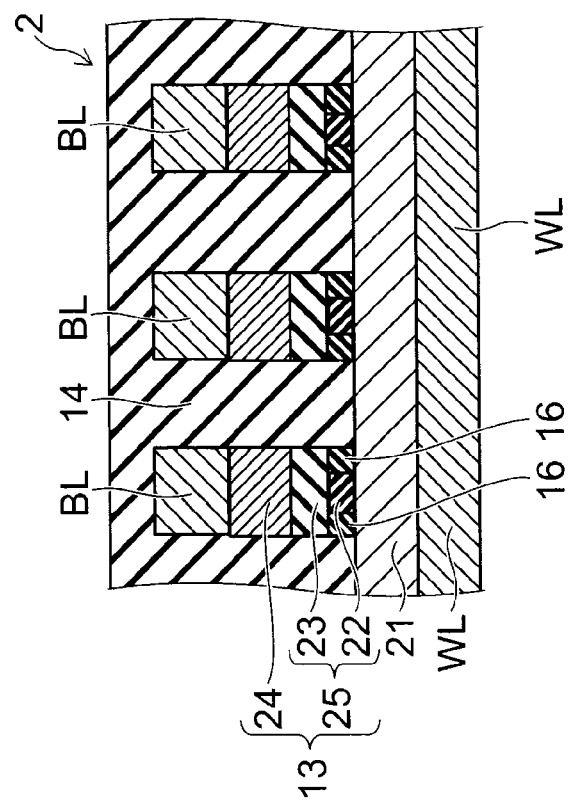

FIGS. 10A and 10B are cross-sectional views showing a resistance random access memory device according to the embodiment.

As shown in FIGS. 10A and 10B, the resistance random access memory device 2 according to the embodiment differs from the resistance random access memory device 1 according to the first embodiment described above (referring to FIGS. 1A to 1C) in that the air gap 15 is not made between the rectifying layer 22 and the inter-layer insulating film 14; and an insulating film 16 in which filaments do not form easily is provided between the rectifying layer 22 and the inter-layer insulating film 14. Also, the device 2 differs from the device 1 in that the configuration of the electrode layer 21 is not a pillar configuration but is a line configuration extending in the X direction. The insulating film 16 is formed of an insulating material in which the metal, e.g., silver, which is included in the ion source layer 24 as the ion source, does not diffuse easily.

In the embodiment as well, similarly to the first embodiment described above, the operations of the memory cell 20 can be stabilized by limiting the formation region of the filament F in the rectifying layer 22 while ensuring the adhesion between the retention layer 23 and the ion source layer 24.

Additionally, in the embodiment, the mechanical strength of the pillar 13 is high because, instead of the air gap 15, the insulating film 16 is filled between the rectifying layer 22 and the inter-layer insulating film 14; and the height of the pillar 13 is reduced by the height of the electrode layer 21 that is not included in the pillar 13.

Otherwise, the configuration, the manufacturing method, the operations, and the effects of the embodiment are similar to those of the first embodiment described above.

A third embodiment will now be described.

Figure 11:
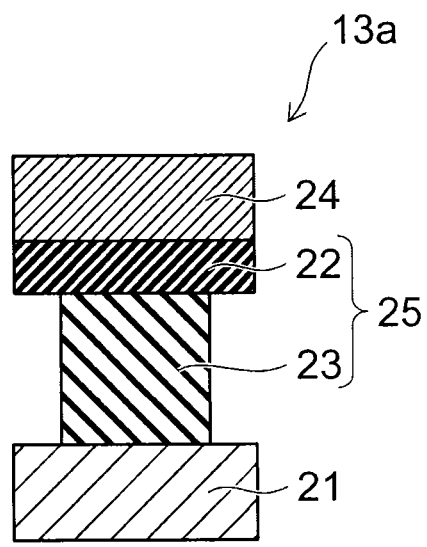
FIG. 11 is a cross-sectional view showing one pillar of a resistance random access memory device according to a third embodiment.

FIG. 11 is a cross-sectional view showing one pillar of a resistance random access memory device according to the embodiment.

As shown in FIG. 11, a pillar 13a of the resistance random access memory device according to the embodiment differs from the pillar 13 of the first embodiment described above (referring to FIG. 1B) in that the stacking order of the rectifying layer 22 and the retention layer 23 is reversed; and the rectifying layer 22 contacts the ion source layer 24. Also, the width of the retention layer 23 which is distal to the ion source layer 24 is narrower than the width of the rectifying layer 22 which is proximal to the ion source layer 24.

In the embodiment, the operations of the memory cell 20 can be stabilized by limiting the formation region of the filament F in the retention layer 23. Also, the adhesion between the rectifying layer 22 and the ion source layer 24 can be guaranteed by ensuring the contact surface area between the rectifying layer 22 and the ion source layer 24.

Otherwise, the configuration, the manufacturing method, the operations, and the effects of the embodiment are similar to those of the first embodiment described above.

A fourth embodiment will now be described.

Figure 12:
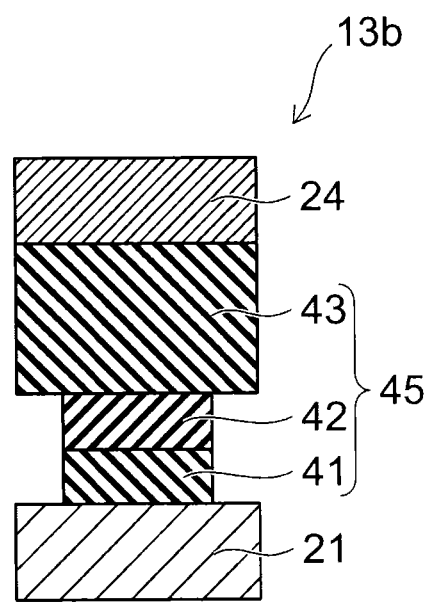
FIG. 12 is a cross-sectional view showing one pillar of a resistance random access memory device according to a fourth embodiment.

FIG. 12 is a cross-sectional view showing one pillar of a resistance random access memory device according to the embodiment.

As shown in FIG. 12, a pillar 13b of the resistance random access memory device according to the embodiment differs from the pillar 13 of the first embodiment described above (referring to FIG. 1B) in that a variable resistance film 45 is provided instead of the variable resistance film 25 which is made of the rectifying layer 22 and the retention layer 23. In the variable resistance film 45, a silicon oxide layer 41, an amorphous silicon layer 42, and a silicon oxide layer 43 are stacked in this order from the electrode layer 21 toward the ion source layer 24; and the silicon oxide layer 43 contacts the ion source layer 24. The widths of the silicon oxide layer 41 and the amorphous silicon layer 42 are narrower than the width of the silicon oxide layer 43. The width of the silicon oxide layer 43 is equivalent to the width of the ion source layer 24.

In the embodiment as well, similarly to the first embodiment described above, the operations of the memory cell can be stabilized by constraining the formation region of the filament F in the silicon oxide layer 41 and the amorphous silicon layer 42; and the adhesion between the silicon oxide layer 43 and the ion source layer 24 can be ensured.

Otherwise, the configuration, the manufacturing method, the operations, and the effects of the embodiment are similar to those of the first embodiment described above.

A fifth embodiment will now be described.

Figure 13:
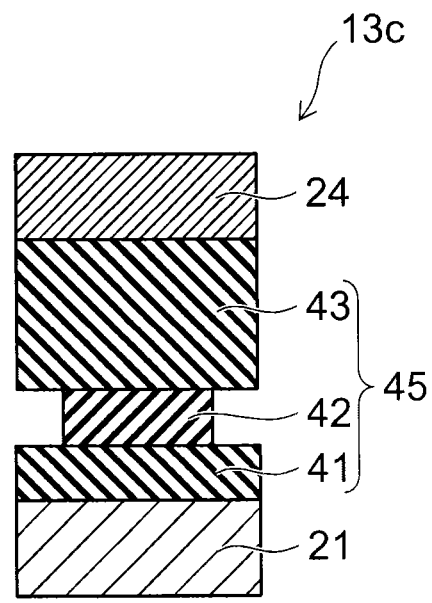
FIG. 13 is a cross-sectional view showing one pillar of a resistance random access memory device according to a fifth embodiment.

FIG. 13 is a cross-sectional view showing one pillar of a resistance random access memory device according to the embodiment.

As shown in FIG. 13, a pillar 13c of the resistance random access memory device according to the embodiment differs from the pillar 13b of the fourth embodiment described above (referring to FIG. 12) in that, among the layers of the variable resistance film 45, only the width of the amorphous silicon layer 42 is narrower than the width of the silicon oxide layer 43; and the width of the silicon oxide layer 41 is about the same as the width of the silicon oxide layer 43.

Otherwise, the configuration, the manufacturing method, the operations, and the effects of the embodiment are similar to those of the fourth embodiment described above.

A sixth embodiment will now be described.

Figure 14:
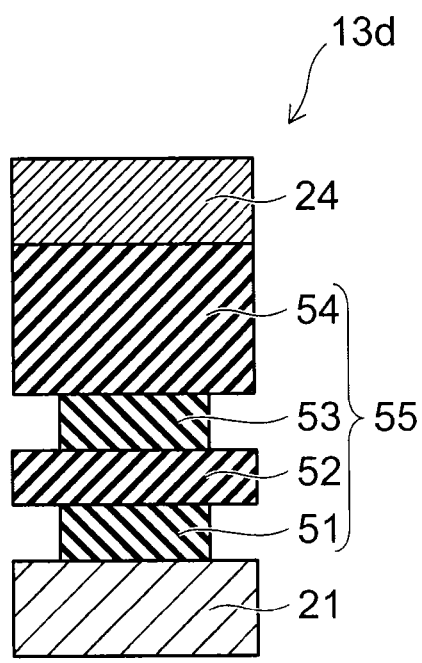
FIG. 14 is a cross-sectional view showing one pillar of a resistance random access memory device according to a sixth embodiment.

FIG. 14 is a cross-sectional view showing one pillar of a resistance random access memory device according to the embodiment.

As shown in FIG. 14, a pillar 13d of the resistance random access memory device according to the embodiment differs from the pillar 13 of the first embodiment described above (referring to FIG. 1B) in that a variable resistance film 55 is provided instead of the variable resistance film 25. In the variable resistance film 55, an amorphous silicon layer 51, a silicon oxide layer 52, an amorphous silicon layer 53, and a silicon oxide layer 54 are stacked in this order from the electrode layer 21 toward the ion source layer 24; and the silicon oxide layer 54 contacts the ion source layer 24. The widths of the amorphous silicon layers 51 and 53 are narrower than the width of the silicon oxide layer 54; and the width of the silicon oxide layer 52 is about the same as the width of the silicon oxide layer 54.

Otherwise, the configuration, the manufacturing method, the operations, and the effects of the embodiment are similar to those of the first embodiment described above.

A seventh embodiment will now be described.

Figures 15A, 15B:
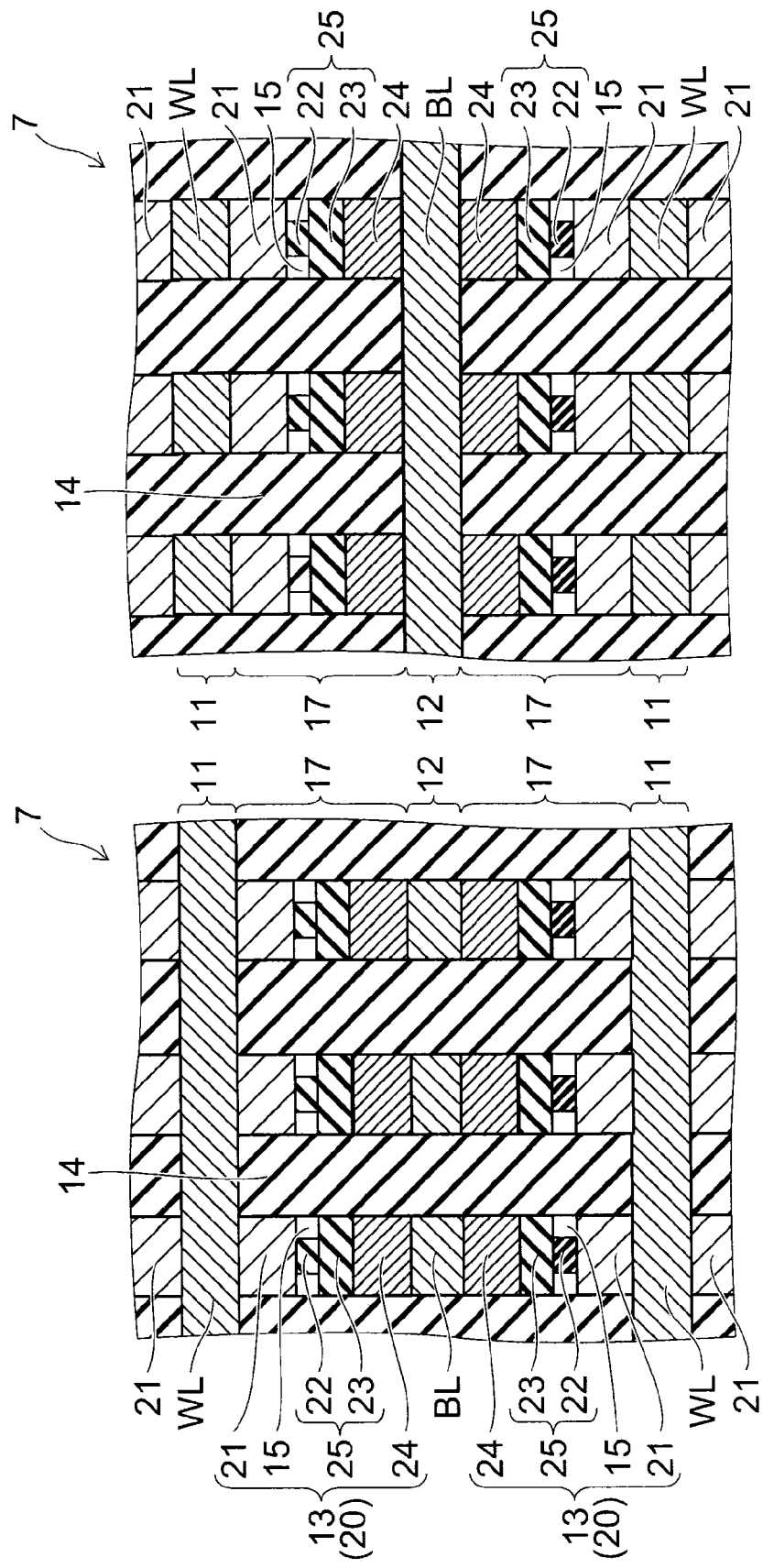
FIGS. 15A and 15B are cross-sectional views showing a resistance random access memory device according to a seventh embodiment.

FIGS. 15A and 15B are cross-sectional views showing a resistance random access memory device according to the embodiment.

In the resistance random access memory device 7 according to the embodiment as shown in FIGS. 15A and 15B, at least two layers of the structure described in the first embodiment described above are stacked. In other words, the word line interconnect layer 11 is stacked alternately with the bit line interconnect layer 12; and a memory array layer 17 is disposed between each word line interconnect layer 11 and each bit line interconnect layer 12. The multiple pillars 13 are disposed inside the inter-layer insulating film 14 in the memory array layer 17.

Then, the stacking order inside the pillar 13 belonging to the memory array layer 17 having the word line interconnect layer 11 disposed therebelow and the bit line interconnect layer 12 disposed thereabove is reversed from the stacking order inside the pillar 13 belonging to the memory array layer 17 having the bit line interconnect layer 12 disposed therebelow and the word line interconnect layer 11 disposed thereabove. In other words, in each of the pillars 13, the ion source layer 24 is disposed on the bit line BL side; and the variable resistance film 25 is disposed on the word line WL side.

The device 7 according to the embodiment can be manufactured by repeating the method described in the first embodiment described above.

The memory cell 20 according to the embodiment can be integrated three-dimensionally.

Otherwise, the configuration, the operations, and the effects of the embodiment are similar to those of the fourth embodiment described above.

An eighth embodiment will now be described.

Figures 16A, 16B:
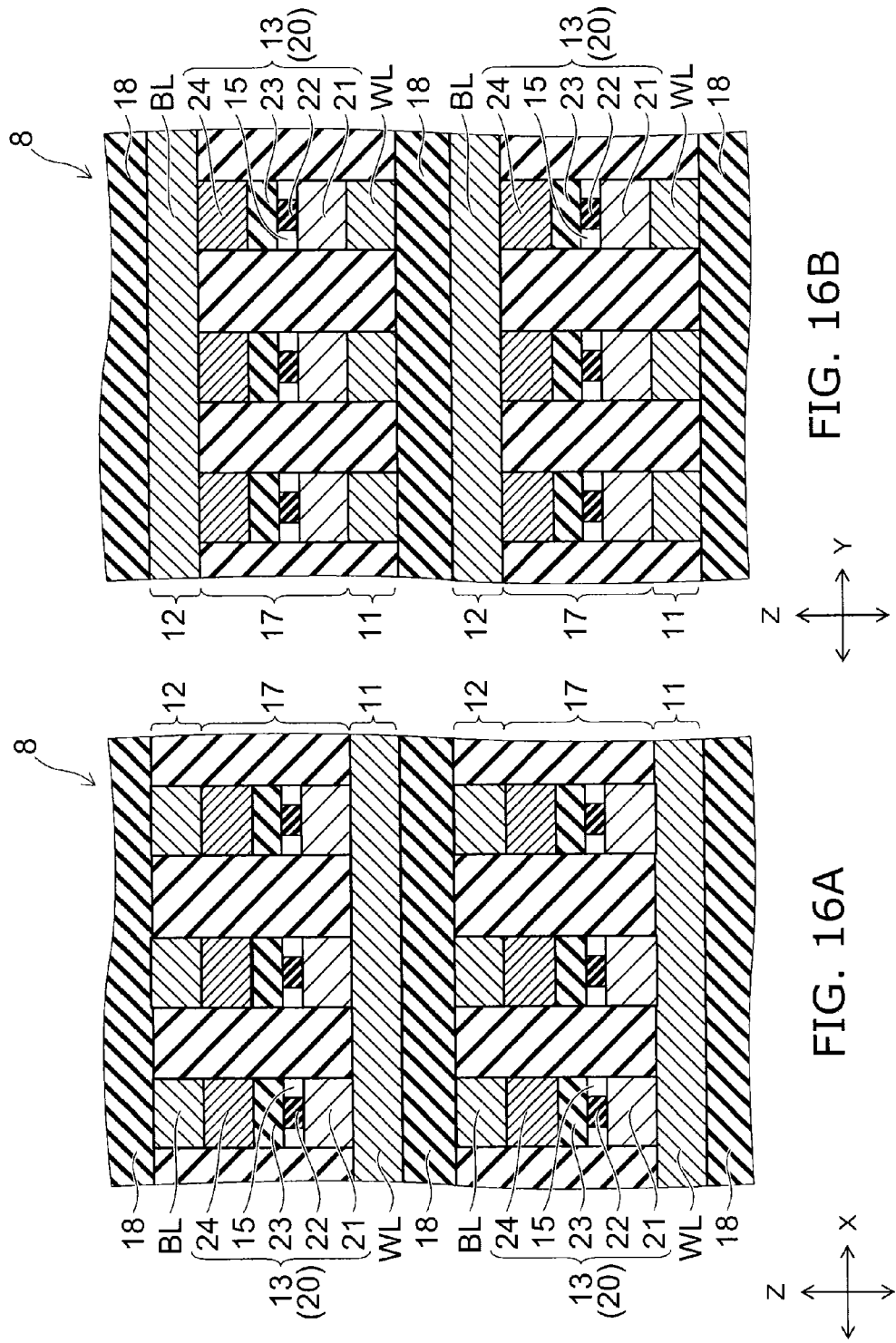
FIGS. 16A and 16B are cross-sectional views showing a resistance random access memory device according to an eighth embodiment.

FIGS. 16A and 16B are cross-sectional views showing a resistance random access memory device according to the embodiment.

As shown in FIGS. 16A and 16B, the resistance random access memory device 8 according to the embodiment differs from the resistance random access memory device 7 according to the seventh embodiment described above (referring to FIGS. 15A and 15B) in that the stacked bodies that are made of one layer each of the word line interconnect layer 11, the memory array layer 17, and the bit line interconnect layer 12 are electrically isolated from each other by an inter-layer insulating film 18. In other words, the memory array layer 17 exists at the position where the word line interconnect layer 11 is disposed therebelow and the bit line interconnect layer 12 is disposed thereabove; but at the position where the bit line interconnect layer 12 is disposed therebelow and the word line interconnect layer 11 is disposed thereabove, the memory array layer 17 does not exist and the inter-layer insulating film 18 exists instead.

According to the embodiment, compared to the sixth embodiment described above, a common stacking order of the pillar 13 can be used for the entire device 8. Thereby, a common formation process of the pillar 13 can be used; and the manufacturing of the device 8 is easier.

Otherwise, the configuration, the operations, and the effects of the embodiment are similar to those of the seventh embodiment described above.

A ninth embodiment will now be described.

Figure 17B:
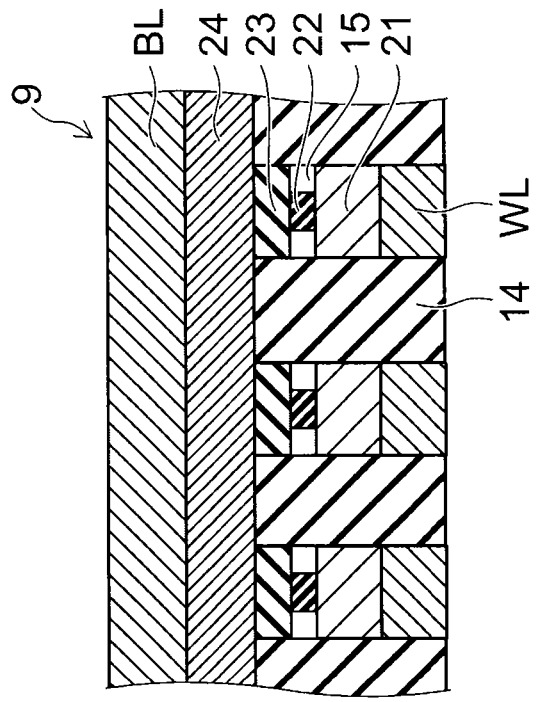
FIGS. 17A and 17B are cross-sectional views showing a resistance random access memory device according to a ninth embodiment.
Figure 17B:
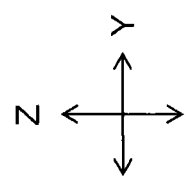
Figure 17A:
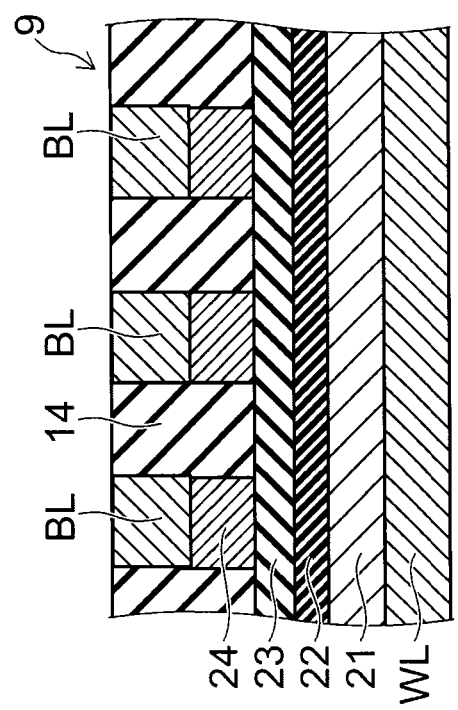
Figure 17A:
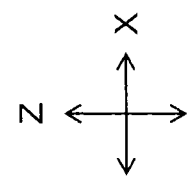

FIGS. 17A and 17B are cross-sectional views showing a resistance random access memory device according to the embodiment.

As shown in FIGS. 17A and 17B, the resistance random access memory device 9 according to the embodiment differs from the resistance random access memory device 1 according to the first embodiment described above (referring to FIGS. 1A to 1C) in that the stacked body made of the electrode layer 21, the rectifying layer 22, and the retention layer 23 is formed not in a pillar configuration but in a line configuration that extends in the X direction as does the word line WL; and the ion source layer 24 is formed not in a pillar configuration but in a line configuration that extends in the Y direction as does the bit line BL. The width of the rectifying layer 22 is narrower than the width of the retention layer 23 when viewed from the X direction.

According to the embodiment, the manufacturing of the device 9 is easy because the variable resistance film 25 and the ion source layer 24 are not patterned into pillar configurations.

Otherwise, the configuration, the operations, and the effects of the embodiment are similar to those of the first embodiment described above.

According to the embodiments described above, a resistance random access memory device having highly stable operations can be realized.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention. Additionally, the embodiments described above can be combined mutually.

What is claimed is:

1. A resistance random access memory device, comprising:
   a first resistance change layer comprising a first material;
   a second resistance change layer provided on the first resistance change layer, the second resistance change layer comprising a second material different from the first material;
   an ion source layer provided on the second resistance change layer, the ion source layer comprising a metal, the metal being able to reversibly move within the first resistance change layer and within the second resistance change layer; and
   an inter-layer insulating film disposed around a stacked body comprising the first resistance change layer, the second resistance change layer, and the ion source layer,
   a width of the first resistance change layer being narrower than a width of the second resistance change layer as viewed from a first direction and a second direction intersecting the first direction,
   an air gap being provided between the first resistance change layer and the inter-layer insulating film, and
   the second resistance change layer being in contact with the inter-layer insulating film.

2. The device according to claim 1, wherein the second resistance change layer contacts the ion source layer.

3. The device according to claim 1, wherein the first material is material selected from the group consisting of silicon, silicon oxide, silicon nitride, hafnium oxide, and hafnium oxynitride, and combinations thereof, and the second material is material selected from the group consisting of silicon, silicon oxide, silicon nitride, hafnium oxide, and hafnium oxynitride, and combinations thereof.

4. The device according to claim 1, further comprising:
   a third resistance change layer provided below the first resistance change layer; and an electrode layer provided below the third resistance change layer.

5. The device according to claim 1, wherein a filament made of the metal forms and decomposes more easily within the first resistance change layer than within the second resistance change layer.

6. The device according to claim 1, wherein the first material is silicon, the second material is silicon oxide, and the metal is silver.

7. The device according to claim 1, wherein the first resistance change layer and the second resistance change layer have a filament made of the metal, the filament decomposes more easily within the second resistance change layer than within the first resistance change layer.

8. The device according to claim 1, wherein the first material is silicon oxide, the second material is silicon, and the metal is silver.

9. The device according to claim 1, further comprising:
a first interconnect provided under the first resistance change layer to extend in the first direction; and
a second interconnect provided on the ion source layer to extend in the second direction,
the stacked body being electrically connected between the first interconnect and the second interconnect.

10. The device according to claim 9, wherein the first resistance change layer and the second resistance change layer have pillar configurations.

11. The device according to claim 9, wherein the stacked body has a line configuration extending in the first direction.

12. The device according to claim 9, further comprising:
an insulating film provided between the first resistance change layer and the inter-layer insulating film.

13. The device according to claim 9, further comprising:
an additional ion source layer provided on the second interconnect, the additional ion source layer comprising the metal;
a third resistance change layer provided on the additional ion source layer, the third resistance change layer comprising the second material;
a fourth resistance change layer provided on the third resistance change layer, the fourth resistance change layer comprising the first material; and
a third interconnect provided on the fourth resistance change layer to extend in the first direction,
a stacked body comprising the additional ion source layer, the third resistance change layer, and the fourth resistance change layer being connected between the second interconnect and the third interconnect,
a width of the fourth resistance change layer being narrower than a width of the third resistance change layer.

14. The device according to claim 9, further comprising:
the inter-layer insulating film provided on the second interconnect;
a third interconnect provided on the inter-layer insulating film to extend in the first direction;
a third resistance change layer provided on the third interconnect, the third resistance change layer comprising the first material;
a fourth resistance change layer provided on the third resistance change layer, the fourth resistance change layer comprising the second material;
an additional ion source layer provided on the fourth resistance change layer, the additional ion source layer including the metal; and
a fourth interconnect provided on the additional ion source layer to extend in the second direction,
a stacked body comprising the third resistance change layer, the fourth resistance change layer, and the additional ion source layer being connected between the third interconnect and the fourth interconnect,
a width of the third resistance change layer being narrower than a width of the fourth resistance change layer.

15. A resistance random access memory device, comprising:
a first layer;
a second layer stacked with the first layer, the second layer including a metal; and
an inter-layer insulating film disposed around a stacked body comprising the first layer and the second layer,
a resistivity of the first layer being higher than a resistivity of the second layer,
a width of the first layer at a portion of the first layer other than a surface of the first layer on the second layer side being less than a width of the first layer at the surface as viewed from a first direction and a second direction intersecting the first direction,
an air gap being provided between a lower portion of the first layer and the inter-layer insulating film, and
an upper portion of the first layer being in contact with the inter-layer insulating film.

16. The device according to claim 15, wherein ions of the metal are able to move through the first layer.

17. A resistance random access memory device, comprising:
a first interconnect extending in a first direction;
a first resistance change layer provided on the first interconnect, the first resistance change layer being made of silicon;
a second resistance change layer provided on the first resistance change layer, the second resistance change layer being made of silicon oxide;
an ion source layer provided on the second resistance change layer to contact the second resistance change layer, the ion source layer including silver;
a second interconnect provided on the ion source layer to extend in a second direction intersecting the first direction; and
an inter-layer insulating film disposed around a stacked body comprising the first resistance change layer, the second resistance change layer, and the ion source layer,
a width of the first resistance change layer being narrower than a width of the second resistance change layer as viewed from the first direction and the second direction,
an air gap being provided between the first resistance change layer and the inter-layer insulating film, and
the second resistance change layer being in contact with the inter-layer insulating film.

* * * * *